(12) United States Patent
Gosen et al.

(10) Patent No.: US 8,755,026 B2
(45) Date of Patent: Jun. 17, 2014

(54) LITHOGRAPHIC APPARATUS AND A DEVICE MANUFACTURING METHOD

(75) Inventors: Jeroen Gerard Gosen, Geldrop (NL); Albert Johannes Maria Jansen, Eindhoven (NL); Nicolaas Ten Kate, Almkerk (NL); Marco Koert Stavenga, Eindhoven (NL); Koen Steffens, Veldhoven (NL); Laurentius Johannes Adrianus Van Bokhoven, Veldhoven (NL); Henricus Jozef Castelijns, Bladel (NL); Koen Cuypers, Lommel (BE)

(73) Assignee: ASML Netherlands B.V., Veldhoven (NL)

( * ) Notice: Subject to any disclaimer, the term of this patent is extended or adjusted under 35 U.S.C. 154(b) by 445 days.

(21) Appl. No.: 12/969,656

(22) Filed: Dec. 16, 2010

(65) Prior Publication Data

US 2011/0149258 A1 Jun. 23, 2011

Related U.S. Application Data

(60) Provisional application No. 61/287,941, filed on Dec. 18, 2009.

(51) Int. Cl.
*G03B 27/52* (2006.01)
*G03B 27/58* (2006.01)

(52) U.S. Cl.
USPC .............................. 355/30; 355/72

(58) Field of Classification Search
USPC ................................ 355/72, 73, 30
See application file for complete search history.

(56) References Cited

U.S. PATENT DOCUMENTS

| | | | |
|---|---|---|---|
| 4,509,852 A | 4/1985 | Tabarelli et al. | |
| 6,952,253 B2 | 10/2005 | Lof et al. | |
| 7,193,232 B2 | 3/2007 | Lof et al. | |
| 7,240,679 B2 * | 7/2007 | Woods et al. | 134/95.2 |
| 7,342,640 B2 | 3/2008 | Kamono | |
| 7,397,533 B2 | 7/2008 | Verhagen et al. | |
| 7,470,501 B2 | 12/2008 | Endo et al. | |
| 7,616,383 B2 | 11/2009 | Streefkerk et al. | |

(Continued)

FOREIGN PATENT DOCUMENTS

| | | |
|---|---|---|
| EP | 1 420 300 | 5/2004 |
| JP | 2005-277363 | 10/2005 |

(Continued)

OTHER PUBLICATIONS

Japanese Office Action mailed Jul. 31, 2012 in corresponding Japanese Patent Application No. 2010-276685.

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

An immersion lithographic apparatus is disclosed that includes a table having a surface and a sensor, or a target for a sensor, or both, the sensor and/or target having a first area which is lyophobic to immersion liquid and a second area which is lyophilic to immersion liquid, and a liquid displacement device configured to displace liquid on the sensor and/or target, the liquid displacement device comprising a gas outlet opening configured to direct a gas flow toward the first and second areas, wherein a property of a part of the gas flow directed to the first area is different to a property of a part of the gas flow directed to the second area.

21 Claims, 6 Drawing Sheets

(56) References Cited

U.S. PATENT DOCUMENTS

| | | |
|---|---|---|
| 7,641,404 B2 | 1/2010 | Hamada |
| 7,701,550 B2 | 4/2010 | Kemper et al. |
| 2005/0225735 A1 | 10/2005 | Magome et al. |
| 2006/0077367 A1* | 4/2006 | Kobayashi et al. ............. 355/53 |
| 2006/0139594 A1 | 6/2006 | Hara et al. |
| 2008/0007704 A1 | 1/2008 | Leenders et al. |
| 2008/0212046 A1* | 9/2008 | Riepen et al. ................... 355/30 |
| 2009/0002651 A1* | 1/2009 | To ................................... 355/30 |
| 2009/0262316 A1* | 10/2009 | Kohno et al. ................... 355/30 |
| 2010/0060868 A1 | 3/2010 | Tanasa et al. |
| 2010/0157260 A1 | 6/2010 | Knaapen et al. |

FOREIGN PATENT DOCUMENTS

| | | |
|---|---|---|
| JP | 2007-318117 | 12/2007 |
| JP | 2009-010289 | 1/2009 |
| WO | 99/49504 | 9/1999 |
| WO | 2005/022616 | 3/2005 |
| WO | 2005/064405 | 7/2005 |

* cited by examiner

-- PRIOR ART --

-- PRIOR ART --

-- PRIOR ART --

-- PRIOR ART --
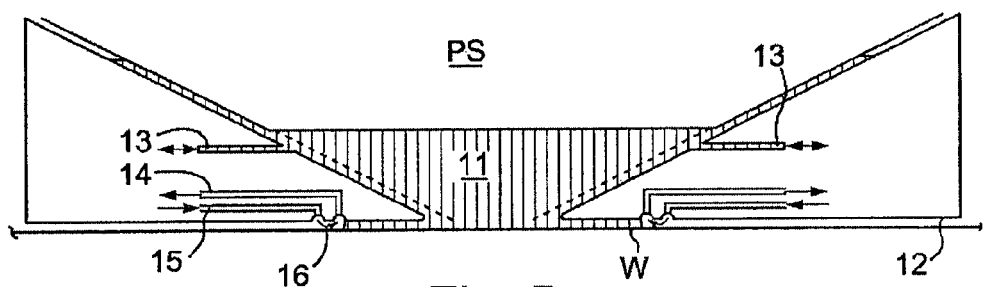
Fig. 5
Fig. 6
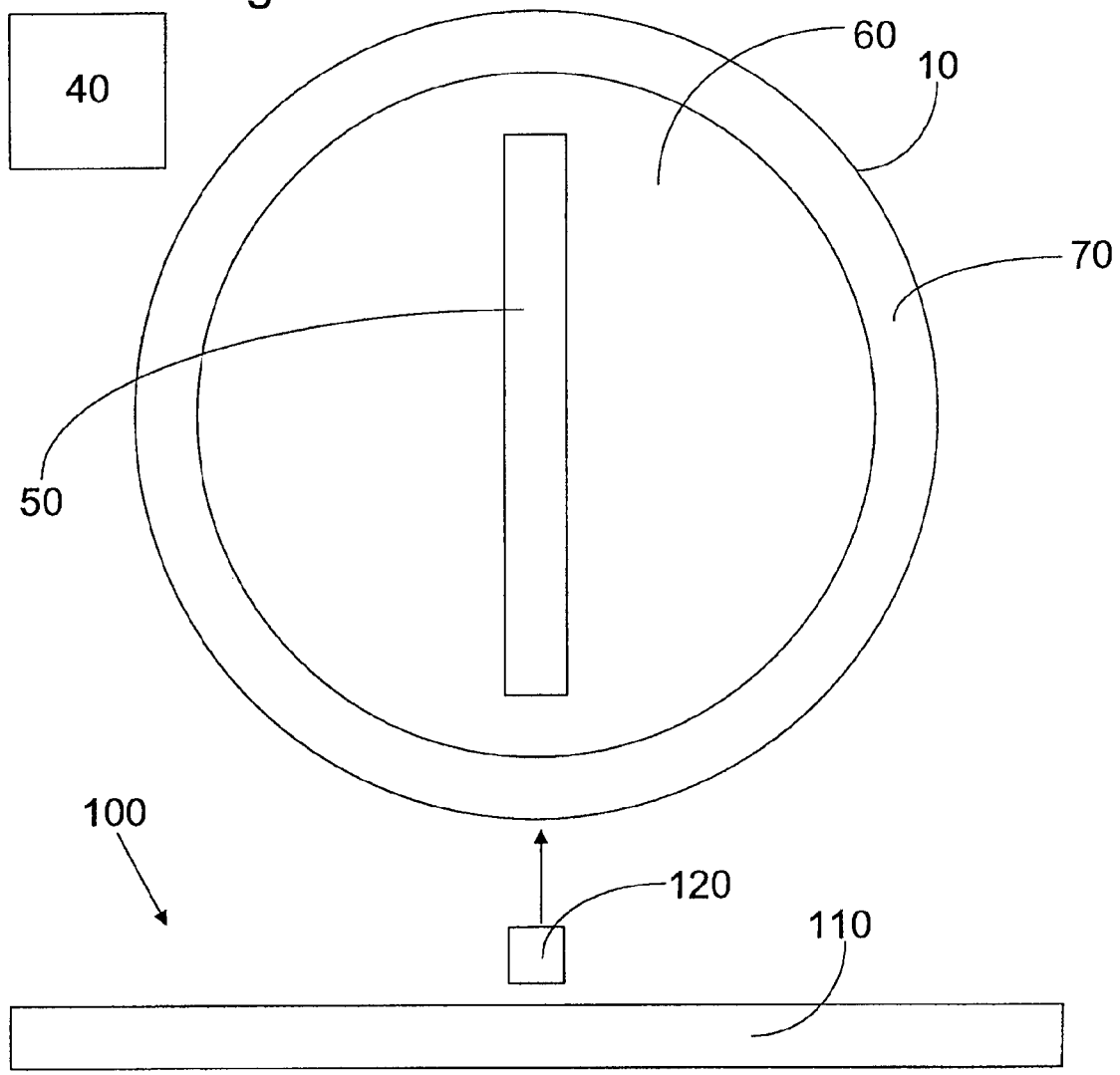

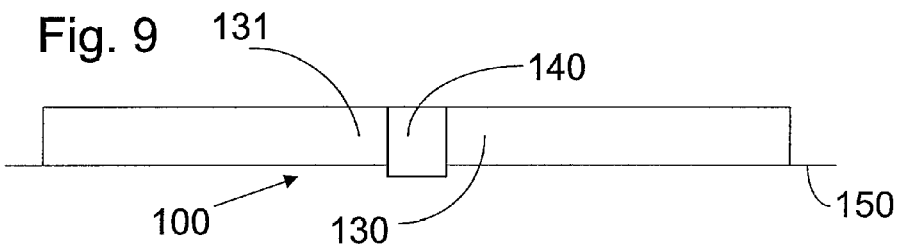
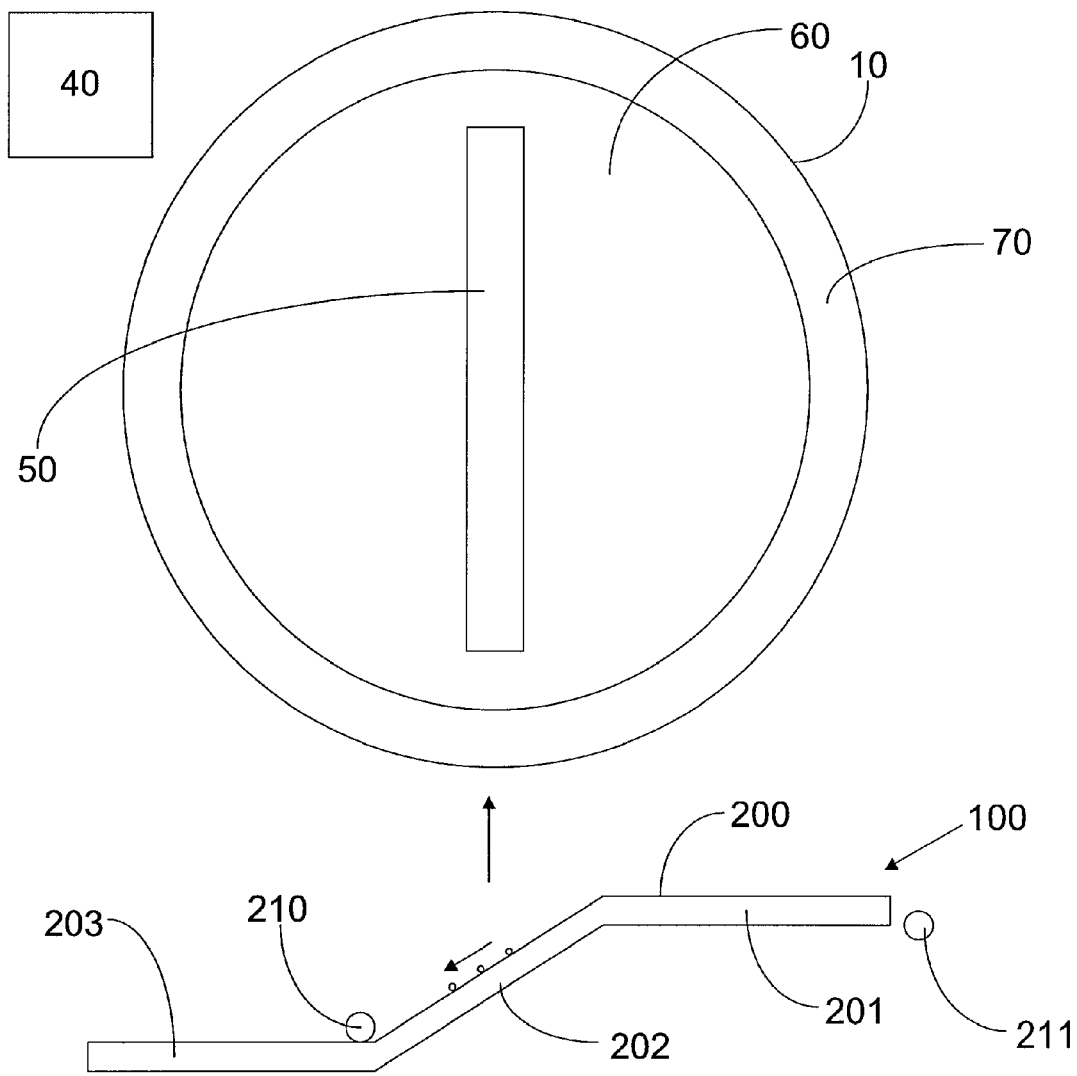

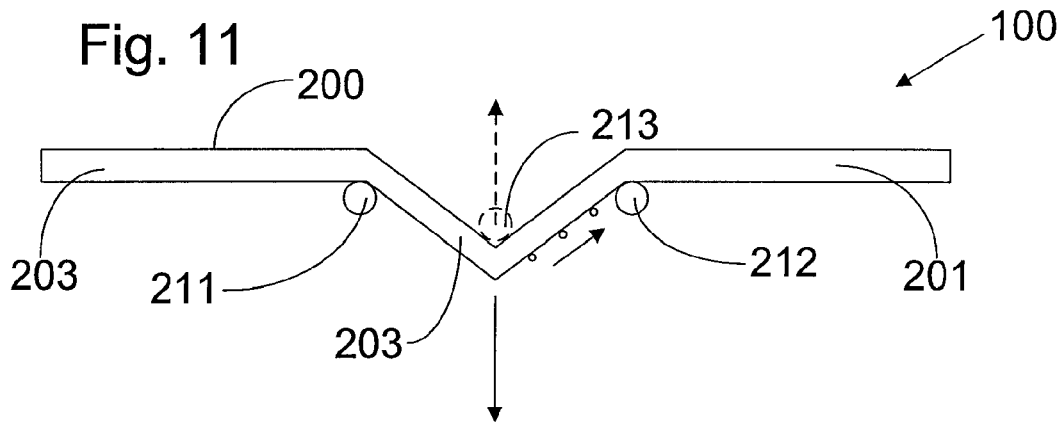
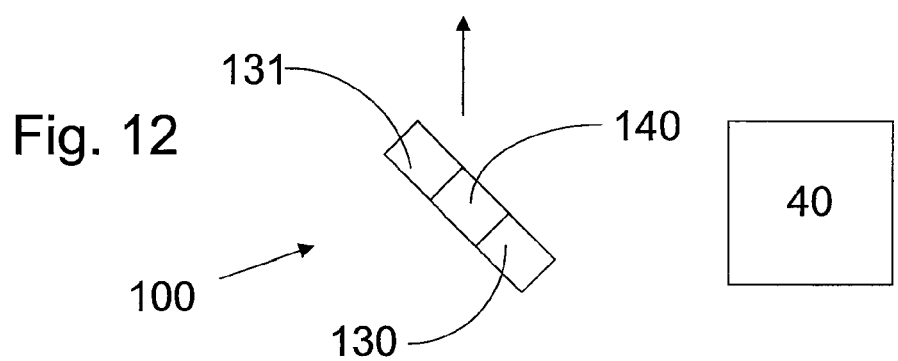
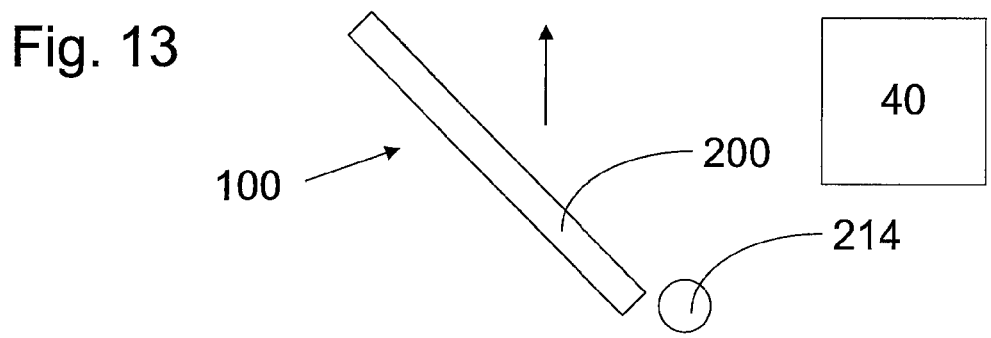
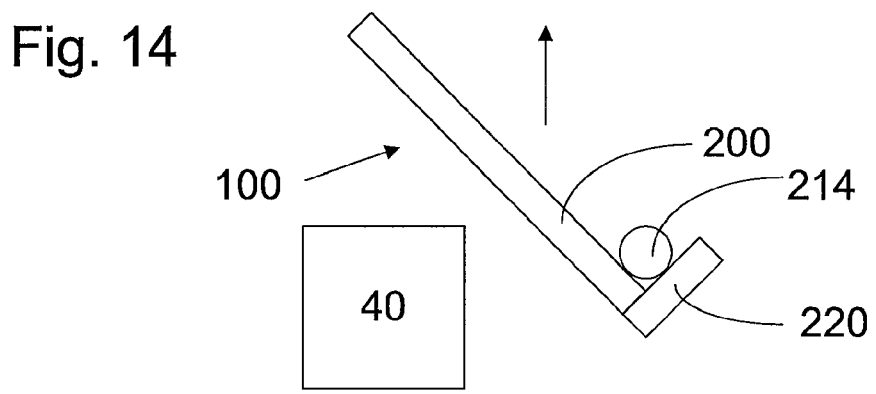

LITHOGRAPHIC APPARATUS AND A DEVICE MANUFACTURING METHOD

This application claims priority and benefit under 35 U.S.C. §119(e) to U.S. Provisional Patent Application No. 61/287,941, entitled "A Lithographic Apparatus and A Device Manufacturing Method", filed on Dec. 18, 2009. The content of that application is incorporated herein in its entirety by reference.

FIELD

The present invention relates to a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an, immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. Iii reference to the aforementioned description, reference in this paragraph to a feature defined with respect to fluid may be understood to include a feature defined with respect to liquid.

SUMMARY

A liquid film or droplet (hereinafter reference to a droplet includes reference to a film) left on a surface may cause a measurement inaccuracy.

It is desirable, for example, to provide a lithographic apparatus in which a potentially adverse effect of a liquid droplet left on a sensor and/or target for a sensor is reduced.

According to an aspect, there is provided an immersion lithographic apparatus is disclosed that includes a table having a surface and at least one selected from: a sensor and/or a target for a sensor, the sensor and/or target having a first area which is lyophobic to immersion liquid and a second area which is lyophilic to immersion liquid, and a liquid displacement device configured to displace liquid on the sensor and/or target, the liquid displacement device comprising at least one gas outlet opening configured to direct a gas flow toward the first and second areas, wherein a property of a part of the gas flow directed to the first area is different to a property of a part of the gas flow directed to the second area.

According to an aspect, there is provided a device manufacturing method comprising: projecting an image of a pattern through an immersion liquid onto a first substrate held by a substrate table having a target, or a sensor, or both; unloading the first substrate from substrate table; loading a second substrate onto the substrate table; measuring a property of the target and/or using the sensor while the second substrate is held by substrate table; and displacing liquid from the target, or the sensor, or both, using a gas flow directed to a lyophobic area and a lyophilic area of the sensor and/or target, wherein a property of a part of a gas flow directed to the lyophobic area is different to a property of a part of the gas flow directed to the lyophilic area.

According to an aspect, there is provided a device manufacturing method comprising: projecting an image of a pattern through an immersion liquid onto a first substrate held by a substrate table, the immersion liquid being confined between a projection system and a substrate by a liquid confinement structure; transferring the liquid confinement structure to a measurement table having a target, or a sensor, or both; unloading the first substrate from the substrate table; loading a second substrate onto the substrate table; measuring a property of a target and/or using the sensor; and displacing liquid from the target and/or the sensor using a flow of gas wherein a property of a part of the gas flow directed to a lyophobic area is different to a property of a part of a gas flow directed to a lyophilic area.

According to an aspect, there is provided an immersion lithographic apparatus comprising: a table having a surface and at least one selected from: a sensor and/or a target for, a sensor, the sensor and/or target having a first area which is lyophobic to immersion liquid and a second area which is lyophilic to immersion liquid; a liquid displacement device configured to displace liquid on the sensor and/or target; and a controller configured to control relative movement between the liquid displacement device and the sensor and/or target in a direction other than perpendicular to an elongate direction of a gas outlet opening of the liquid displacement device.

According to an aspect, there is provided an immersion lithographic apparatus comprising: a table having a surface and at least one selected from: a sensor and/or a target for a sensor, the sensor and/or target having a first area which is lyophobic to immersion liquid and a second area which is lyophilic to immersion liquid; and a liquid displacement device configured to displace liquid on the sensor and/or target, the liquid displacement device comprising at least one gas outlet opening in fluid communication with a first gas supply and a second gas outlet opening in fluid communication with a second gas supply, wherein the pressure of the first gas supply is higher than the pressure of the second gas supply.

According to an aspect, there is provided an, immersion lithographic apparatus comprising: a table having a surface and at least one selected from: a sensor and/or a target for a sensor, the sensor and/or target having a first area which is lyophobic to immersion liquid and a second area which is lyophilic to immersion liquid; and a liquid displacement device configured to displace liquid on the sensor and/or target, the liquid displacement device comprising a first gas outlet opening which has a larger cross sectional area than a second gas outlet opening, the first gas outlet opening configured to direct gas to the second area and the first gas outlet opening configured to direct gas to the first area.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further liquid supply system for use in a lithographic projection apparatus;

FIG. 6 depicts, in plan, a sensor, such as a transmission image sensor (TIS), and a liquid displacement device;

FIG. 9 depicts, in cross-section, a liquid displacement device;

FIG. 10 depicts, in plan, a sensor and a liquid displacement device;

FIG. 11 depicts, in plan, a sensor and a liquid displacement device;

FIG. 12 depicts, in plan, a sensor and a liquid displacement device;

FIG. 13 depicts, in plan, a sensor and a liquid displacement device; and

FIG. 14 depicts, in plan, a sensor and a liquid displacement device.

DETAILED DESCRIPTION

Figure 1:
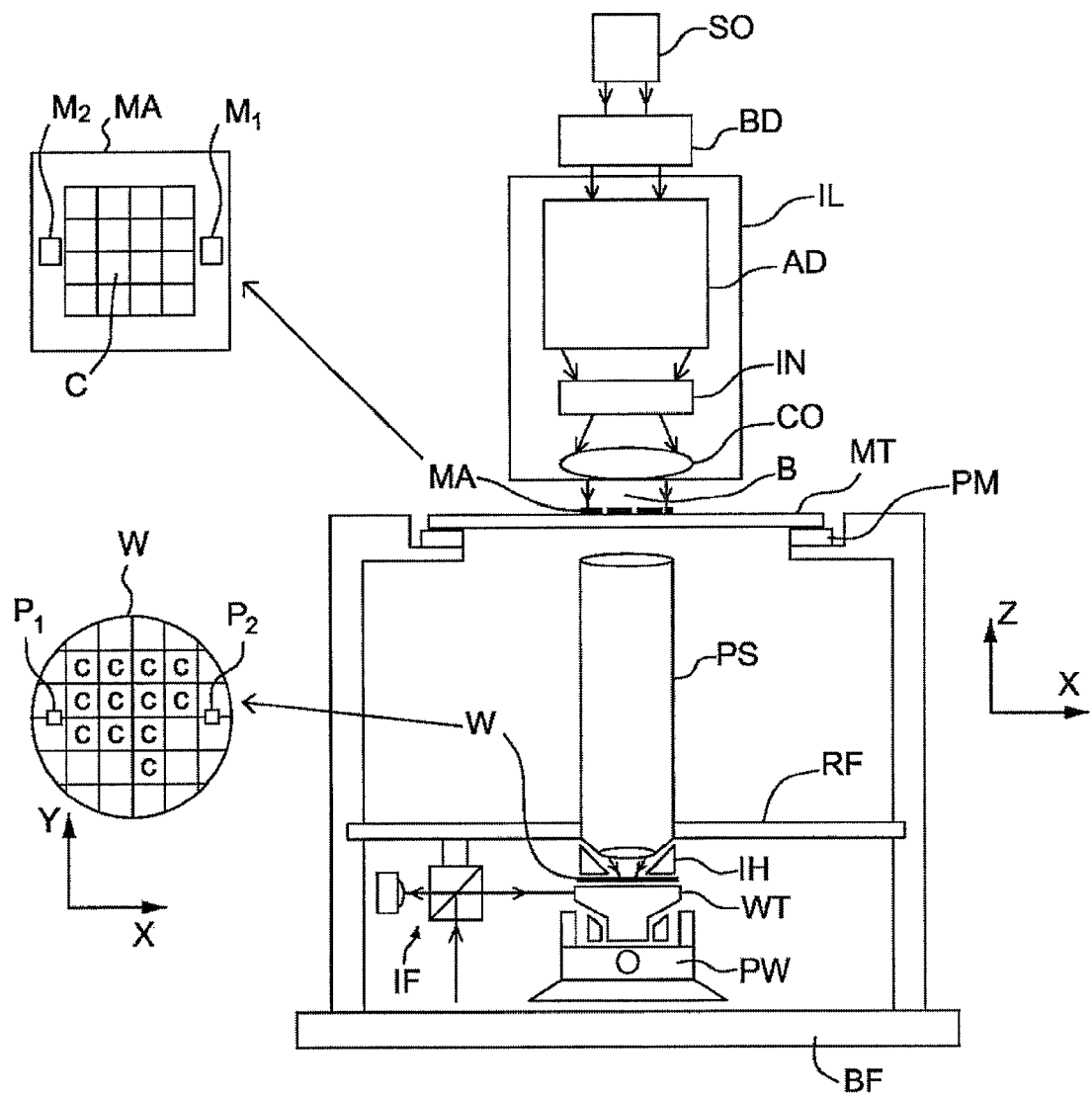
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5.

Figure 2:
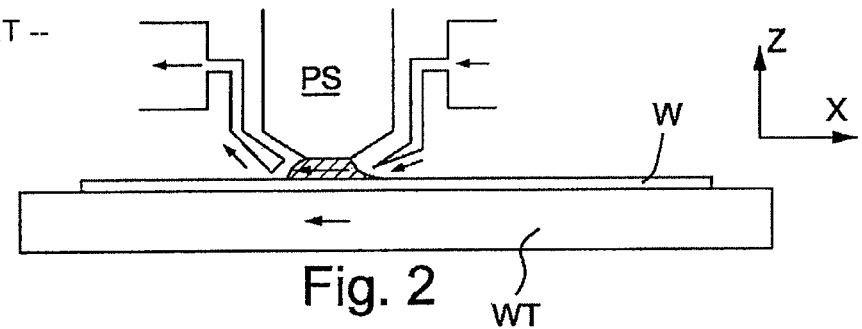
FIGS. 2 and 3 depict a liquid supply system for use in a lithographic projection apparatus.
Figure 3:
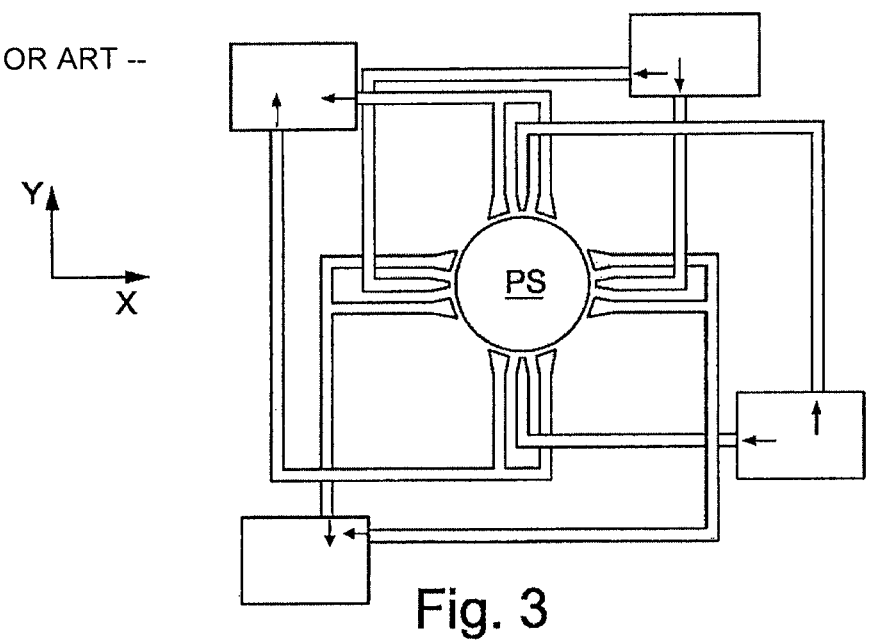

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
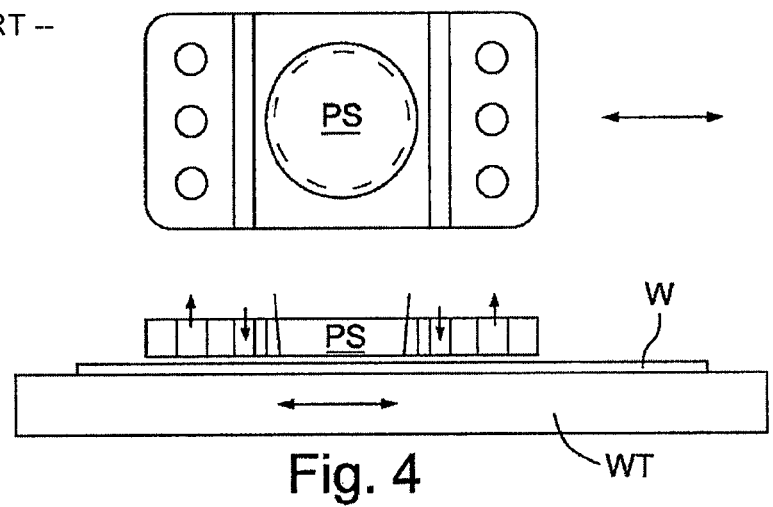
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Another arrangement which has been proposed is to provide the liquid supply system with a fluid confinement structure. The fluid confinement structure may extend along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). A seal is formed between the fluid confinement structure and the surface of the substrate. In an embodiment, a seal is formed between the fluid confinement structure and the surface of the substrate and may be a contactless seal such as a gas seal. Such a system is disclosed in United States patent application publication no. US 2004-0207824. In an embodiment, the fluid confinement structure is used to confine liquid and so may be referred to as a liquid confinement structure.

FIG. 5 schematically depicts a localized liquid supply system or fluid handling structure or device with a body 12 forming a barrier member or fluid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid handling structure is substantially stationary relative to the projection system PS in the XY plane though there may be some relative movement in the Z direction (in the direction of the optical axis). In an embodiment, a seal is formed between the body 12 and the surface of the substrate W and may be a contactless seal such as a gas seal or fluid seal.

The fluid handling device at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case. The inner periphery may be any shape, for example the inner periphery may conform to the shape of the final element of the projection system. The inner periphery may be round.

The liquid is contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm desirably 5 to 50 μm. In an embodiment, the porous material is at least slightly liquidphilic (e.g., hydrophilic), i.e. having a contact angle of less than 90° to the immersion liquid, e.g. water.

Many other types of liquid supply system are possible. An embodiment of the present invention may be advantageous for use with a confined immersion system in which the liquid between the final element of the projection system and the substrate is confined, for example, in optimizing the use. However, an embodiment of the present invention can be used with, and is not limited to, any particular type of liquid supply system.

An embodiment of the invention may be used in all wet immersion apparatus. In the all wet embodiment, fluid is allowed to cover the whole of the substrate and all or part of the top surface of the substrate table, for example, by allowing liquid to leak out of a confinement structure which confines liquid to between the final element of projection system and the substrate. An example of a fluid handling structure for an all wet embodiment can be found in U.S. patent application no. U.S. 61/136,380 filed on 2 Sep. 2008.

In an immersion lithographic apparatus, immersion liquid may be left on a table, such as a substrate table, after completion of exposure of a substrate. This may particularly occur in an unconfined or all wet immersion apparatus but may occur in a localized apparatus if a droplet escapes from the liquid confinement structure. Such a droplet left behind on the table may be undesirable. In particular, a table, such as a substrate table supporting a substrate, often has one or more sensor devices and/or targets in or on its surface. For example, the substrate table may be provided with one or more fiducials. A fiducial is typically used during a pre-measurement phase prior to exposure of the substrate. For example, the fiducial may be used as a reference point to establish the position of one or more markers on the substrate. A fiducial may comprise a marker detectable by an alignment sensor and correspond to an alignment marker on a substrate permanently formed in a fixed plate. An image sensor, such as a TIS, may be located underneath or in fixed relationship to the marker. A fiducial may also or alternatively include a flat area acting as a reference plane for a level or height sensor. Other sensors or sensor targets that may be included in the substrate table include a grid plate for a position encoding system, an energy sensor and/or interferometric aberration sensor.

In an embodiment, one or more sensor may alternatively or additionally be provided on a measurement table which is not adapted to support a substrate. The measurement table may be moved under the projection system to measure characteristics of the projection system. Such measurements may be made in a wet state or in a dry state. If such measurements are made in a wet state i.e. through immersion liquid confined by the fluid handling system, one or more droplets may be left behind on the measurement table because of imperfect operation of the fluid handling system. If measurements are made in a dry state, liquid may also end up on the measurement table through splashing or from drips dropping from parts of the apparatus, such as from the fluid handling system.

The presence of residual immersion liquid, such as water, on a sensor or sensor target may cause problems through one or more causes. The presence of a residual immersion liquid as a droplet when a measurement is being taken can cause erroneous readings if the measurement system and procedure is designed to make a measurement in the dry state. In addition or alternately, evaporation of a residual immersion liquid droplet may leave behind a drying stain. A drying stain may affect a measurement or may cause localized cooling. Localized cooling may cause deformation of the sensor, e.g. a reference sensor. In this way an erroneous sensor measurement may be made. A sensor or sensor target may have a liquidphilic surface, i.e. a surface that attracts liquid, or a surface that becomes liquidphilic during use of the apparatus, e.g. through exposure to radiation of the projection beam. Thus liquid may often be present on the sensor or sensor target.

In a so-called dual-stage lithographic apparatus, a substrate is first loaded onto a substrate table, various measurements are made at a measurement station and then the table and substrate are transferred to an exposure station to be exposed. After all exposures on the substrate are complete, the exposed substrate is unloaded and a new substrate loaded onto the table. A liquid droplet left on the substrate table after exposure of the preceding substrate may, therefore adversely affect measurements made on the succeeding substrate, by its presence and/or by the effects of its evaporation. In particular, when a droplet evaporates it may locally cool the surface from which it evaporates. Localized cooling of the surface may cause temporary or permanent deformation thereof. A drying stain may be left behind. Such problems are particularly acute if the surface on which the droplet was left is a part of a sensor, or a target of a sensor that makes measurements in the dry state, i.e. without liquid between sensor and target. In this case, if the droplet is still present when a measurement is taken, an erroneous measurement may result. In an embodiment, a liquid displacement device may be provided to remove such a droplet, e.g. by blocking its path past the liquid displacement device and/or moving the liquid displacement device relative to the surface on which the droplet is situated.

The presence of a droplet on a sensor and/or a target of a sensor which comprise areas which are both lyophobic to immersion liquid and areas which are lyophilic to immersion liquid may cause difficulty for a liquid displacement device.

An embodiment of the invention addresses one or more of these or other undesirable outcomes by providing a liquid displacement device. The liquid displacement device is arranged to displace liquid from the sensor target by use of a (localized) gas flow directed towards the sensor or target. In an embodiment, the gas may be: air; a clean, dry gas, such as air; a gas which is an artificial air; $N_2$ or another inert gas, such as a noble gas. Since the sensor or target is usually a relatively small area on the substrate table, it may be sufficient merely to displace any liquid droplet that is on the sensor or target to an adjacent area of the substrate table where its presence may cause no harm or substantially no risk of harm or damage. Alternatively, the liquid droplet may be completely removed from the substrate table.

It is desirable to remove the liquid droplet from the substrate table, or at least the sensor or target, as soon as possible, in order to minimize evaporative effects. According to an embodiment, a liquid displacement device 100 is attached to the liquid handling system 12.

An embodiment of the present invention will now be described with reference to a standalone liquid displacement device 100. It will be understood that the liquid displacement device 100 may be attached to the fluid handling system 12 as described above or to another component. Additionally, an embodiment of the invention will be described with reference to displacing liquid from a sensor 10. However as will be apparent from the above description the liquid displacement device 100 can be used to remove liquid from any sensor, target for a sensor, or other surface from liquid should be blocked or removed.

FIG. 6 shows, in plan, a sensor 10. An optically active central part 50 is usually lyophilic. This may be because lyophobic coatings are sensitive to the radiation from the projection system PS and so cannot be used on the area of the central part 50 where radiation from the projection system PS impinges. The central lyophilic part 50 is surrounded by a lyophobic area 60. The lyophobic area 60 is desired because it is easier to remove liquid from a lyophobic surface and thereby reduces difficulties with liquid remaining on a surface. Around the outside of the sensor 10 is an outer area 70 which is again lyophilic. This area is lyophilic because it is close to, for example, a sticker which bridges a gap between the sensor 10 and the top surface of the substrate table WT on which the sensor 10 is mounted. The sticker will not stick to a lyophobic coating so that the outer area of the sensor 10 is made lyophilic so that the sticker can stick to it. Some of the lyophilic area will not be covered by the sticker because of tolerances.

Removing a droplet from a lyophilic surface involves a larger moving force to displace liquid from it than a lyophobic surface. A larger moving force can be achieved by, for example, establishing a stronger pressure gradient at substrate level. In an embodiment, the pressure gradient is achieved by gas supply from a nozzle of the liquid displacement device 100. The stronger pressure gradient will involve larger gas velocity from the gas supply nozzle, a smaller normal distance between the substrate and the nozzle, or a combination of both. Using a larger gas flow may cause undesired dynamical distortion of the sensor, target or table. Additionally or alternatively, it may result in splashing of droplets and the fast evaporation of droplets which can lead to cooling of the surface or any nearby surface exposed to droplet splashing.

An embodiment of the present invention is directed to a liquid displacement device 100 which addresses one or more of the above-mentioned or other difficulties. For instance, the liquid displacement device 100 reduces the total amount of gas pressure which is used to displace liquid from the sensor 10 while still helping to ensure that droplets are blocked by the liquid displacement device 100 and/or removed from the lyophilic and/or lyophobic surfaces during relative movement between the liquid displacement device 100 and the sensor 10.

Above a certain relative speed between the liquid displacement device 100 and the sensor 10, it may not be possible to completely block the passage of liquid past the liquid displacement device 100 in the case of a lyophilic surface. Thus, a film of liquid may remain on the lyophilic surface after passage of the liquid displacement device 100. However, the film of liquid may be made thin enough so that it evaporates before the sensor is actually used. In this description, the term "block" means that the passage of droplets is blocked but this does not necessarily mean that the passage of liquid is blocked as a liquid film may be left behind after the passage of the liquid displacement device 100 over the droplet as described above. In order to block droplets on a lyophilic surface using a gas flow, a larger blocking/removing force (e.g. gas pressure) than the pressure used to block droplets on a lyophobic surface is required. However a larger gas velocity, flow rate and/or pressure is undesirable. This is because it may cause undesired dynamic distortion of the table, splashing of droplets and/or fast evaporation of droplets which undesirably cool the surface.

The below described embodiments have been developed to reduce the total required gas velocity, flow rate and/or pressure. Additionally or alternatively, an excessive flow rate through a small channel which might be needed to remove droplets from a lyophilic surface can lead to an unstable gas flow. Thus the performance of such a liquid displacement device can undesirably vary with time. Additionally or alternatively, thermal cooling of the gas due to adiabatic expansion can lead to cooling of the sensor and/or target and this may therefore need to be compensated for by additional heating of the sensor. Additionally or alternatively, strong local shear flows may lead to heating of the substrate.

FIG. 6 shows a liquid displacement device, in plan, according to an embodiment of the invention. The liquid displacement device 100 is configured to displace liquid from the sensor 10 and/or from a target for a sensor. The liquid displacement device 100 is configured with at least one gas outlet opening to direct a gas flow towards the lyophilic and lyophobic areas. The gas outlet opening may be in the form of a gas knife.

A property of a part of the gas flow directed to the lyophilic area is different to a property of a part of the gas flow directed to the lyophobic area. The different property results in a greater blocking/removal force on droplets in the lyophilic area compared to the blocking/removal force on droplets in the lyophobic area. In this way the liquid displacement device is tuned to use as little gas flow as possible. A lower gas flow can be used on the lyophobic area than on the lyophilic area.

The property which is different may be at least one selected from: gas flow rate, gas velocity, gas pressure, and/or geometry, in plan, of the gas flow.

In FIG. 6 it is the geometry, in plan, of the gas flow which is different for the gas flow directed towards the lyophilic area 50 and the lyophobic area 60. This is achieved by providing the liquid displacement device 100 with a first gas outlet opening 110 which directs a flow of gas over the whole of the sensor 10 and a second gas outlet opening 120 which directs a flow of gas at only the lyophilic inner area 50.

While there is relative movement, under control of controller 40, between the liquid displacement device 100 and the sensor 10, first the second gas outlet opening 120 passes over the lyophobic inner area 50 and then the first gas outlet opening 110 passes over both of the lyophilic 50 and lyophobic 60 areas. In this way a larger blocking/removal force is applied on droplets in the inner lyophilic area 50 than on the lyophobic area 60.

The gas flow out of the first and second gas outlet openings 110, 120 may be equal or may be different. In one embodiment the gas flow rate and/or velocity and/or pressure out of the second gas outlet opening 120 is greater than the corresponding gas flow rate and/or gas velocity and/or gas pressure out of the first gas outlet opening 110.

The first gas outlet opening 110 is elongate. The second gas outlet opening 120 may also be elongate. In that case the second gas outlet opening 120 may be parallel to the first gas outlet opening 110. The second gas outlet opening 120 may not be elongate.

The controller 40 is provided to control the relative movement between the liquid displacement device 100 and the sensor 10. When it is desired to remove liquid from the sensor 10 (e.g. before a measurement is taken, which may be at a measurement position rather than in the exposure position) the controller 40 controls the relative movement between the liquid displacement device 100 and the sensor 10. The controller 40 controls the relative movement such that the second gas outlet opening 120 passes over the sensor 10 such that the flow of gas out of the second gas outlet opening 120 passes substantially only over the lyophilic area 50. The relative movement further causes the flow of gas out of the first gas outlet opening 110 to pass over both the inner lyophilic area 50 as well as the lyophobic area 60. The flow of gas out of either the first or second gas outlet opening 110, 120 impinges on the sensor 10 first.

A difficulty with the embodiment of FIG. 6 may be that the provision of a gap between the first and second gas outlet openings 110, 120 could result in an acoustic disturbance. The embodiments of FIGS. 7-14 may address this difficulty by providing first and second gas outlet openings closer together and in the case of the embodiment of FIGS. 13 and 14 by providing only a single gas outlet opening. Additionally or alternatively, it may be possible to provide a single gas outlet opening in which the property of gas directed towards the lyophilic inner area 50 is different to the lyophobic outer area 60, for example, by changing the geometry of the gas outlet opening along its length.

Figure 7:
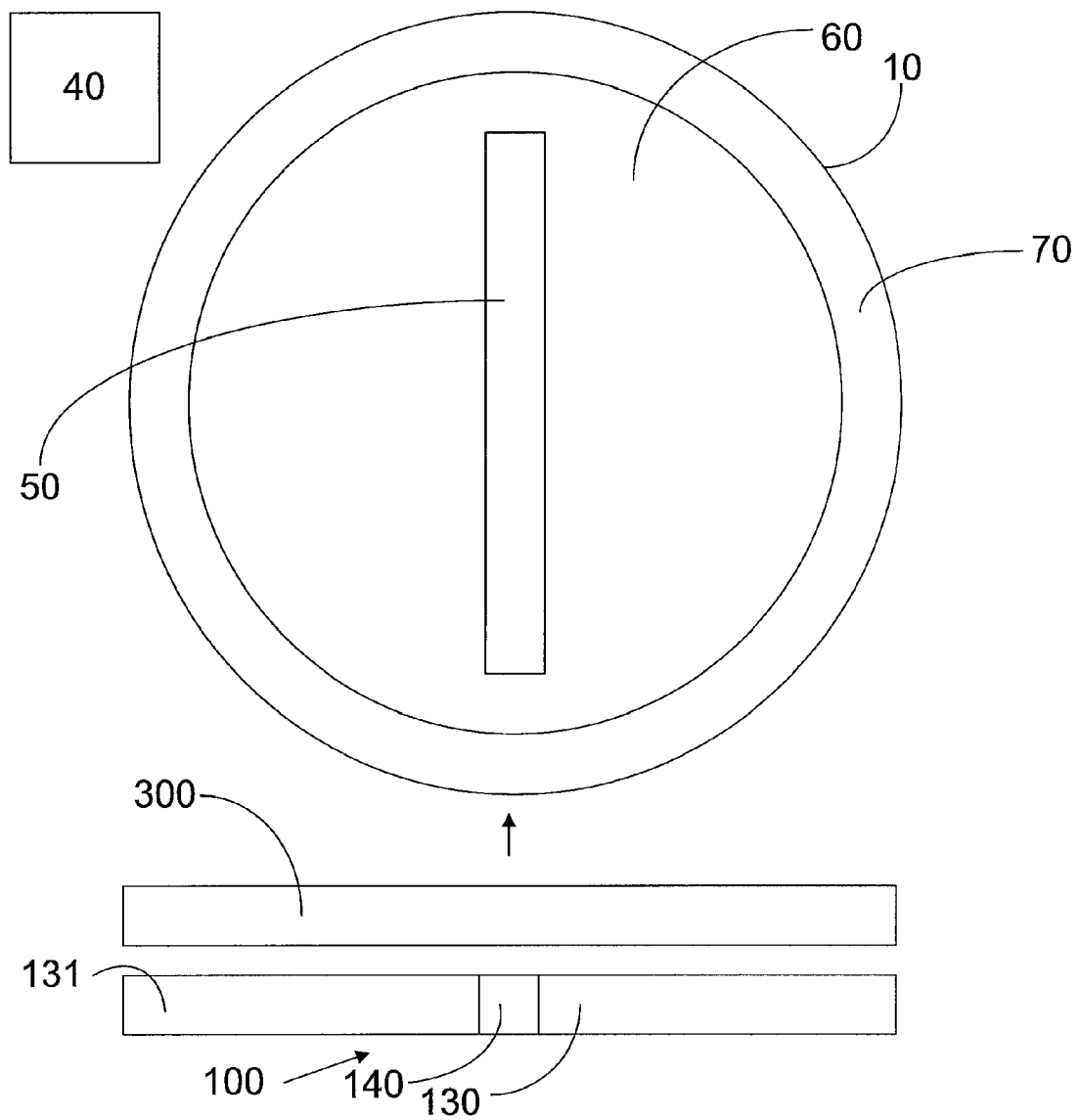
FIG. 7 depicts, in plan, a sensor and a liquid displacement device.

FIG. 7 illustrates a further embodiment, in plan, which is the same as the FIG. 6 embodiment except as described below. In FIG. 7, the liquid displacement device 100 has three gas outlet openings 130, 131, 140. A first pair of gas outlet openings 130,131 are configured to direct a gas flow at the lyophobic area 60. A second gas outlet opening 140 (positioned between the first pair of gas outlet openings 130, 131) is configured to direct gas at the central lyophilic area 50.

The liquid displacement device 100 is configured such that the first pair of gas outlet openings 130, 131 are connected to a gas supply at a different pressure to the gas supply to which the second gas outlet opening 140 is connected. The first pair of gas outlet openings 130, 131 could be connected to the same gas supply or to different gas supplies. Thus the property of gas flow directed by the second gas outlet opening 140 to the inner lyophilic area 50 has a greater pressure, velocity and/or flow rate compared to the flow of gas directed by the first pair of gas outlet openings 130, 131 to the lyophobic outer area 60.

FIG. 7 shows an additional feature which may be present in any of the embodiments herein. The additional feature is an extraction opening 300 which is connected to an under pressure source. The extraction opening 300 is positioned adjacent the gas outlet openings 130, 140, 131. In this way, gas and/or liquid is extracted through the extraction opening 300. Providing the extraction opening 300 reduces the total required gas flow out of the gas outlet openings 130, 140, 131. Providing a gas flow out of the extraction opening 300 results in the gas flow out of gas outlet openings 130, 131, 140 being biased towards the extraction opening 300. Without the extraction opening 300 the gas flow in the direction of the extraction opening 300 and in the direction opposite to the extraction opening 300 is likely to be about equal. However, by providing extraction through the extraction opening 300, for example at a rate of 200% of the gas flow out of the outlet openings 130, 131, 140, a distribution of 80% of the gas flow out of gas outlet openings 130, 131, 140 in the direction towards the extraction opening 300 is achievable.

Desirably the liquid displacement device 100 is configured so that the majority of the flow out of the gas outlet openings 130, 131, 140 is in the direction of relative movement between the liquid displacement device 100 and the sensor 10. If relative movement is in both directions, i.e., forward and backward, then it may be desirable to provide an extraction opening 300 on both sides of the gas outlet openings 130, 131; 140. In this way, under control of the controller 40, one or the other of the extraction openings 300 may be connected to an under pressure source depending upon the direction of relative movement between the liquid displacement device 100 and the surface being cleaned, for example, sensor 10. In this way, the total gas flow required can be reduced because it is possible to ensure that the gas flow out of the gas outlet openings 130, 131, 140 is in the same direction as the direction of relative movement between the liquid displacement device 100 and the sensor 10 (i.e., the direction illustrated by the arrow in FIG. 7).

The extraction opening 300 may be made shorter so that it extracts gas predominantly exiting the second opening 140. In this way, the angle of impingement of gas exiting the second opening 140 on to the lyophilic area 50 may be different to the angle of impingement of gas directed out of the first openings 130, 131 on to the lyophobic outer area 60. In this way, a greater blocking force on droplets in the lyophilic area 50 than on the lyophobic area 60 may be achieved.

Figure 8:
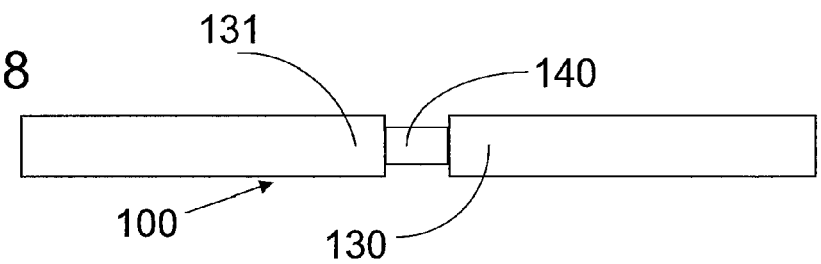
FIG. 8 depicts, in plan, a sensor and a liquid displacement device.

The embodiment of FIG. 8 is the same as the embodiment of FIG. 7 except as described below. In the embodiment of FIG. 8 the first pair of gas outlet openings 130, 131 are connected to a pressure source which is at the same pressure as the second gas outlet opening 140. All gas outlet openings 130, 131, 140 may be connected to the same gas source, for example. However, the cross sectional area of the second gas outlet opening 140 is smaller than the cross sectional area of the first pair of gas outlet openings 130, 131. Thus, the velocity of gas exiting the second gas outlet opening 140 is greater than the velocity of gas exiting the first pair of gas outlet openings 130, 131.

FIG. 9 shows, in cross-section, an embodiment which is the same as the embodiments of FIGS. 7 and 8 except as described below. In the embodiment of FIG. 9, the second gas outlet opening 140 protrudes from the surface 150 in which the gas outlet openings 130, 131, 140 are formed. That is, the gas outlet opening 140 protrudes from the surface 150 compared to the first pair of gas outlet openings 130, 131. In an alternative embodiment the first pair of gas outlet openings 130, 131 could be recessed in the surface 150 more than the second gas outlet opening 140. The result of the different distances of the outlet(s) from the surface of the sensor 10 is that different pressures of gas form on the surface. The outlet which is closest to the surface of the sensor 10 provides a higher gas pressure at the surface as well as a higher shear force to scrape droplets from the surface. Thus a greater blocking/removal force on droplets is applied by the second gas outlet opening 140 on the droplets on the inner lyophilic area 50 compared to the blocking/removal force due to gas flow out of the first pair of gas outlet openings 130, 131 on droplets on the lyophobic area 60.

FIG. 10 illustrates, in plan, a further embodiment. The embodiment of FIG. 10 may comprise at least two gas outlet openings or may comprise a single gas outlet opening 200. The gas flow rate, velocity and pressure may be constant or may vary along the length of the gas outlet opening 200. Alternatively the gas outlet opening 200 may be split into two or more gas outlet openings with different gas flow rates and/or velocity and/or pressure. In both embodiments the geometry, in plan, of the gas flow exiting the gas outlet opening 200 is different for the gas flow impinging on the inner lyophilic area 50 compared to that on the outer lyophobic area 60.

The gas outlet 200 is split into first, second and third parts or openings 201, 202, 203. The first, second and third parts are elongate. The elongate direction of the first and third parts 201, 203 make an angle to the elongate direction of the second part 202. That is, they are not parallel. In an embodiment, the angle is at least 10°, at least 20°, at least 30°, at least 40°, at least 50° or at least 60°.

When there is relative movement, under the control of the controller 40, between the liquid displacement device 100 and the sensor 10, the second part 202 passes over the central lyophilic area 50. Additionally, the controller 40 helps ensure that the first and third parts 201, 203 have their elongate directions substantially perpendicular to the direction of relative movement between the sensor 10 and the liquid displacement device 100.

Because of the angle of the second part 202, liquid droplets on the central lyophilic area 50 are transported along the second part 202, as illustrated, towards the junction between the first and second parts 201, 202. This sort of transport along the second part 202 involves a lower gas flow than blocking of the droplets. Thus, the liquid is displaced across the lyophilic part 50 onto the lyophobic part 60 where it is much easier to block the droplet without leaving behind a liquid film.

An extractor 210 (e.g. an opening connected to an underpressure source) may be provided at the junction between the first part 201 and second part 202 on a side where droplets which are transported along the second part 202 will collect. The droplets may be extracted by the extractor 210 individually or the droplets may combine to form larger droplets thereby enabling easier extraction by the extractor 210. The extractor 210 is at a discrete location in the same way that the extractors described in United States patent application publication no. US 2008-0007704 function. In order to remove small droplets, the extractor 210 should be closer to the surface than the outlet 200. For example, an extractor may be about 200-400 μm from the surface.

It may be beneficial to the performance of the liquid displacement device 100 of FIG. 10 if the third part 203 is slightly slanted (clockwise as illustrated) to the direction of relative movement between the liquid displacement device 100 and the sensor 10. In this way, droplets are not directed towards the lyophilic area. Additionally or alternatively, the first part 201 could be slanted slightly (clockwise as illustrated) and a further extractor 211 could be provided at the end of the first part 201 opposite to the second part 202 to extract liquid transported along the first part 201.

In a variation on the embodiment of FIG. 10, the first part 201 is slanted in the clockwise direction as illustrated as described above so that droplets move along it away from the second part 202 towards the extractor 211. The extractor 210 may be moved to the end of the third part 203 away from the second part 202. The third part 203 may be angled counterclockwise so that it is angled in the same direction relative to the direction of relative movement between the liquid displacement device 100 and the sensor 10 as the second part 202. The second and third parts 202, 203 may be coplanar, for example. In this way, droplets are moved along the third part 203 away from the second part 202. Thus, it can be seen that both of the first and third parts 201, 202 are angled (a few degrees such as 5-10° is enough) so that droplets move along them away from the lyophilic area 50. An extractor is provided at the outer most end of the first and third parts 201, 203 for the collection of liquid which has been transported along the first and third parts 201, 203. A disadvantage of this arrangement is that the liquid displacement device 100 has a preferred direction and is less effective if used in the direction opposite to that illustrated in FIG. 10.

FIG. 11 illustrates an embodiment which is the same as the embodiment of FIG. 10 except as described below. The embodiment of FIG. 11 also provides gas flows with a different geometry, in plan, to the lyophilic and lyophobic areas 50, 60. In the embodiment of FIG. 11, the first and third parts 201, 203 of the gas outlet opening 200 are substantially co-planar. In order to achieve an angle in the second part 202 so that liquid droplets can be transported along the second part 202, the second part 202 is formed in a V shape. If the controller 40 controls the relative movement between the liquid displacement device 100 and the sensor 10 such that the protruding second part 202 impinges on the sensor 10 first, two extractors 211, 212 are activated on either side of the second part 202 at the junctions with the first and third parts 201, 203. Alternatively, if the controller 40 controls the direction of relative movement between the liquid displacement device 100 and the sensor 10 in the opposite direction, a single extractor 213 may be activated in the recess made by the V shape of the second part 202.

The embodiments of FIGS. 12-14 use the principles illustrated in the embodiment of FIGS. 10 and 11. In particular, the relative movement between the liquid displacement devices 100 and the sensor 10 are controlled by the controller 40 such that an elongated direction of at least a part of the gas outlet opening 200 is non-perpendicular to the direction of relative movement between the liquid displacement device 100 and the sensor 10. This can result in a lower force being required for the blocking/removal of droplets.

The embodiment of FIG. 12 comprises a liquid displacement device 100 similar to that of FIG. 7. The arrangement of the liquid displacement device 100 and the sensor 10 is such that the elongate direction of the gas outlet openings 131, 130, 140 is non-perpendicular to the direction of relative movement between the liquid displacement device 100 and the sensor 10. A lower gas flow rate, velocity and pressure may then be required than for the embodiment of FIG. 7 in which the elongate direction of the gas outlet openings 131, 130, 140 is perpendicular to the direction of relative movement between the liquid displacement device 100 and the sensor 10.

In the embodiments of FIGS. 13 and 14 which are the same as the embodiment of FIG. 12 except as described below, an even lower pressure is used which may not be effective to block/remove the droplets but is effective to move the droplets along the gas outlet opening 200 towards an extractor 214. These embodiments may be useful for more complicated patterns of lyophilic and lyophobic area on the sensor 10. For example, an outer area 70 of the sensor near to the sticker bridging the gap between the sensor 10 and the substrate table WT on which the sensor 10 is mounted may be lyophilic. This area makes an annulus so that a simple geometry of a plurality of gas outlet openings may not be effective to direct a gas flow with greater blocking/removal force at the outer lyophilic area 70 and not the lyophobic area 60. In such a case, the embodiments of liquid displacement devices of FIGS. 13 and 14 may be more suitable. In the embodiment of FIG. 13 a single gas outlet opening 200 is provided along which droplets move. An extractor 214 is provided at an end of the gas outlet opening 200 to which droplets move during relative movement between the liquid displacement device 100 and the sensor 10.

In FIG. 14 the gas outlet opening 200 comprises a second part or alternatively a separate gas outlet opening 220. The gas outlet 220 provides a gas flow which is a barrier for droplets moving along the gas outlet 200 such that they are trapped at the junction between the gas outlet 200 and the part or additional gas outlet opening 220 where they can be extracted by extractor 214.

In any of the above described embodiments the liquid displacement device 100 and/or the sensor 10 may be actuated in a direction perpendicular to the sensor's 10 surface plane. For example, the liquid displacement device 100 may be actuated in the Z direction, the sensor 10 being in the XY plane. The controller 40 may control the height between the liquid displacement device 100 and the surface of the sensor 10 to be a certain value or within a certain range. A map may be made so that the height of the surface of the sensor 10 in the XY plane is accurately known by the system. Alternatively, a sensor may be provided so that the height between the liquid displacement device 100 and the surface may be adjusted using a feedback loop. In one embodiment, the liquid displacement device 100 is stationary relative to the reference frame RF and the sensor is moved relative to the liquid displacement device 100 by using the Z positioner of the table (e.g. substrate table WT) on which the sensor 10 is mounted.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, there is provided an immersion lithographic apparatus comprising: a table having a surface and at least one selected from: a sensor and/or a target for a sensor, the sensor and/or target having a first area which is lyophobic to immersion liquid and a second area which is lyophilic to immersion liquid; and a liquid displacement device configured to displace liquid on the sensor and/or target, the liquid displacement device comprising at least one gas outlet opening configured to direct a gas flow toward the first and second areas, wherein a property of a part of the gas flow directed to the first area is different to a property of a part of the gas flow directed to the second area.

In an embodiment, the different property results in a greater blocking force on droplets in the second area than on droplets in the first area. In an embodiment, the property is at least one selected from: gas flow rate; gas velocity; gas pressure; geometry, in plan, of the gas flow; and/or angle of impingement of gas flow on the sensor. In an embodiment, the liquid displacement device comprises at least two gas outlet openings, at least a first of said at least two gas outlet openings configured to direct gas toward the first area and at least a second of the at least two gas outlet openings configured to direct gas to the second area. In an embodiment, each of the at least first and second gas outlet openings are in fluid communication with a gas supply at, different pressure from each other such that gas exits each of the at least first and second gas outlet openings at a different gas flow rate. In an embodiment, the at least first gas outlet opening is in fluid communication with a gas supply at a lower pressure than the at least second gas outlet opening. In an embodiment, the at least first and second gas outlet openings are in fluid communication with a gas supply providing substantially the same gas flow rate and the at least first gas outlet opening has a different cross sectional area than the at least second gas outlet opening such that gas exits the at least first and second openings at respective different velocities. In an embodiment, the at least first gas outlet opening has a larger cross sectional area than the at least second gas outlet opening. In an embodiment, the at least two gas outlet openings are formed in a surface and the at least first gas outlet opening is recessed in the surface compared to the at least second gas outlet opening or the at least second gas outlet opening protrudes from the surface more than the at least first gas outlet opening such that gas flow out of the at least first and second gas outlet openings causes different gas pressures. In an embodiment, the at least one gas outlet opening is, in plan, elongate and respective elongate directions of a first part and of a second part are at an angle to each other of greater than or equal to 10° such that the geometry, in plan, of the gas flows out of the first and second parts is different. In an embodiment, the immersion lithographic apparatus further comprises a controller configured to cause relative movement between the liquid displacement device and the sensor and/or target such that a direction of the relative movement is such that the angle the elongate direction the first part makes to the direction of relative movement is different to the angle the elongate direction of the second part makes to the direction of relative movement. In an embodiment, the elongate direction of the second part is at a smaller angle to the direction of relative movement than the elongate direction of the first part. In an embodiment, the at least first gas outlet opening is of a different size and/or shape to the at least second gas outlet opening. In an embodiment, the at least first gas outlet opening is elongate such that when there is relative movement between the liquid displacement device and the sensor and/or target the at least first and second gas outlet openings pass over the second area and only the at least first gas outlet opening passes over the first area. In an embodiment, the at least second gas outlet opening is configured to direct gas toward the first area as well as towards the second area.

In an embodiment, there is provided an immersion lithographic apparatus comprising: a table having a surface and at least one selected from: a sensor and/or a target for a sensor, the sensor and/or target having a first area which is lyophobic to immersion liquid and a second area which is lyophilic to immersion liquid; a liquid displacement device configured to displace liquid on the sensor and/or target; and a controller configured to control relative movement between the liquid displacement device and the sensor and/or target in a direction other than perpendicular to an elongate direction of a gas outlet opening of the liquid displacement device.

In an embodiment, there is provided an immersion lithographic apparatus comprising: a table having a surface and at least one selected from: a sensor and/or a target for a sensor, the sensor and/or target having a first area which is lyophobic to immersion liquid and a second area which is lyophilic to immersion liquid; and a liquid displacement device configured to displace liquid on the sensor and/or target, the liquid displacement device comprising at least one gas outlet opening in fluid communication with a first gas supply and a second gas outlet opening in fluid communication with a second gas supply, wherein the pressure of the first gas supply is higher than the pressure of the second gas supply.

In an embodiment, there is provided an immersion lithographic apparatus comprising: a table having a surface and at least one selected from: a sensor and/or a target for a sensor, the sensor and/or target having a first area which is lyophobic to immersion liquid and a second area which is lyophilic to immersion liquid; and a liquid displacement device configured to displace liquid on the sensor and/or target, the liquid displacement device comprising a first gas outlet opening which has a larger cross sectional area than a second gas outlet opening, the first gas outlet opening configured to direct gas to the second area and the first gas outlet opening configured to direct gas to the first area.

In an embodiment, the immersion lithographic apparatus further comprises an extraction opening configured to extract gas exiting the at least one gas outlet opening. In an embodiment, the immersion lithographic apparatus further comprises an actuator configured to vary a distance between the sensor and/or target and the liquid displacement device.

In an embodiment, there is provided a device manufacturing method comprising: projecting an image of a pattern through an immersion liquid onto a first substrate held by a substrate table having a target, or a sensor, or both; unloading the first substrate from substrate table; loading a second substrate onto the substrate table; measuring a property of the target and/or using the sensor while the second substrate is held by substrate table; and displacing liquid from the target, or the sensor, or both, using a gas flow directed to a lyophobic area and a lyophilic area of the sensor and/or target, wherein a property of a part of a gas flow directed to the lyophobic area is different to a property of a part of the gas flow directed to the lyophilic area.

In an embodiment, there is provided a device manufacturing method comprising: projecting an image of a pattern through an immersion liquid onto a first substrate held by a substrate table, the immersion liquid being confined between a projection system and a substrate by a liquid confinement structure; transferring the liquid confinement structure to a measurement table having a target, or a sensor, or both; unloading the first substrate from the substrate table; loading a second substrate onto the substrate table; measuring a property of a target and/or using the sensor; and displacing liquid from the target and/or the sensor using a flow of gas wherein a property of a part of the gas flow directed to a lyophobic area is different to a property of a part of a gas flow directed to a lyophilic area.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
a table having a surface and a sensor, or a target for a sensor, or both, the sensor and/or target having a first area which is lyophobic to immersion liquid and a second area which is lyophilic to immersion liquid; and
a liquid displacement device configured to displace liquid on the sensor and/or target, the liquid displacement device comprising a gas outlet opening configured to direct a gas flow toward the first and second areas simultaneously, wherein a property of a part of the gas flow directed to the first area as, or immediately after, the part of the gas flow directed to the first area exits the gas outlet opening is different to a property of a part of the gas flow directed to the second area as, or immediately after, the part of the gas flow directed to the second area exits the gas outlet opening.

2. The immersion lithographic apparatus of claim 1, wherein the different property results in a greater blocking force on droplets in the second area than on droplets in the first area.

3. The immersion lithographic apparatus of claim 1, wherein the property is at least one selected from:
gas flow rate;
gas velocity;
gas pressure;
geometry, in plan, of the gas flow; and/or
angle of impingement of gas flow on the sensor.

4. The immersion lithographic apparatus of claim 1, wherein the liquid displacement device comprises at least two gas outlet openings, at least a first of the at least two gas outlet openings configured to direct gas toward the first area and at least a second of the at least two gas outlet openings configured to direct gas to the second area.

5. The immersion lithographic apparatus of claim 4, wherein each of the at least first and second gas outlet openings are in fluid communication with a gas supply at different pressure from each other such that gas exits each of the at least first and second gas outlet openings at a different gas flow rate.

6. The immersion lithographic apparatus of claim 5, wherein the at least first gas outlet opening is in fluid communication with a gas supply at a lower pressure than the at least second gas outlet opening.

7. The immersion lithographic apparatus of claim 4, wherein the at least first and second gas outlet openings are in fluid communication with a gas supply providing substantially the same gas flow rate and the at least first gas outlet opening has a different cross sectional area than the at least second gas outlet opening such that gas exits the at least first and second openings at respective different velocities.

8. The immersion lithographic apparatus of claim 7, wherein the at least first gas outlet opening has a larger cross sectional area than the at least second gas outlet opening.

9. The immersion lithographic apparatus of claim 4, wherein the at least two gas outlet openings are formed in a surface and the at least first gas outlet opening is recessed in the surface compared to the at least second gas outlet opening or the at least second gas outlet opening protrudes from the surface more than the at least first gas outlet opening such that gas flow out of the at least first and second gas outlet openings causes different gas pressures.

10. The immersion lithographic apparatus of claim 4, wherein the at least first gas outlet opening is of a different size and/or shape to the at least second gas outlet opening.

11. The immersion lithographic apparatus of claim 4, wherein the at least first gas outlet opening is elongate such that when there is relative movement between the liquid displacement device and the sensor and/or target the at least first and second gas outlet openings pass over the second area and only the at least first gas outlet opening passes over the first area.

12. The immersion lithographic apparatus of claim 4, wherein the at least second gas outlet opening is configured to direct gas toward the first area as well as towards the second area.

13. The immersion lithographic apparatus of claim 1, wherein the at least one gas outlet opening is, in plan, elongate and respective elongate directions of a first part and of a second part are at an angle to each other of greater than or equal to 10° such that the geometry, in plan, of the gas flows out of the first and second parts is different.

14. The immersion lithographic apparatus of claim 13, further comprising a controller configured to cause relative movement between the liquid displacement device and the sensor and/or target such that a direction of the relative movement is such that the angle the elongate direction the first part makes to the direction of relative movement is different to the angle the elongate direction of the second part makes to the direction of relative movement.

15. The immersion lithographic apparatus of claim 14, wherein the elongate direction of the second part is at a smaller angle to the direction of relative movement than the elongate direction of the first part.

16. An immersion lithographic apparatus comprising:
a table having a surface and a sensor, or a target for a sensor, or both, the sensor and/or target having a first area which is lyophobic to immersion liquid and a second area which is lyophilic to immersion liquid;
a liquid displacement device configured to displace liquid on the sensor and/or target, the liquid displacement device comprising a gas outlet opening; and
a controller configured to control relative movement between the liquid displacement device and the sensor and/or target, when a part of the gas outlet opening is at least partially over the second area and a different part of the gas outlet opening is simultaneously at least partially over the first area, in a direction in a plane other than perpendicular to an elongate direction of the part of the gas outlet opening in the plane, the relative movement direction being at a different angle in the plane with respect to the elongate direction of the different part of the gas outlet opening in the plane than with respect to the elongate direction of the part of the gas outlet opening.

17. The immersion lithographic apparatus of claim 16, wherein the gas outlet opening comprises a plurality of separate openings, wherein the part is one opening of the plurality of separate openings and the different part is another opening of the plurality of separate openings.

18. An immersion lithographic apparatus comprising:
a table having a surface and a sensor, or a target for a sensor, or both, the sensor and/or target having a first area which is lyophobic to immersion liquid and a second area which is lyophilic to immersion liquid; and
a liquid displacement device configured to displace liquid on the sensor and/or target, the liquid displacement device comprising a first gas outlet opening in fluid communication with a first gas supply and a second gas outlet opening in fluid communication with a second gas supply, wherein the pressure of the first gas supply is higher than the pressure of the second gas supply and the liquid displacement device is configured such that, when the first gas outlet opening is at least partially over the second area, the first gas outlet opening directs gas at substantially only the second area.

19. An immersion lithographic apparatus comprising:
a table having a surface and a sensor, or a target for a sensor, or both, the sensor and/or target having a first area which is lyophobic to immersion liquid and a second area which is lyophilic to immersion liquid; and
a liquid displacement device configured to displace liquid on the sensor and/or target, the liquid displacement device comprising a first gas outlet opening which has a larger cross sectional area than a second gas outlet opening, and the liquid displacement device is configured such that, when the second gas outlet opening is at least partially over the second area, the second gas outlet opening directs gas at substantially only the second area and the first gas outlet opening directs gas to the first area.

20. A device manufacturing method comprising:
projecting an image of a pattern through an immersion liquid onto a first substrate held by a substrate table having a target, or a sensor, or both;
unloading the first substrate from substrate table;
loading a second substrate onto the substrate table;
measuring a property of the target and/or using the sensor while the second substrate is held by substrate table; and
displacing liquid from the target, or the sensor, or both, using a gas flow directed simultaneously to a lyophobic area and a lyophilic area of the sensor and/or target from a gas outlet opening, wherein a property of a part of a gas flow directed to the lyophobic area as, or immediately after, the part of the gas flow directed to the lyophobic area exits the gas outlet opening is different to a property of a part of the gas flow directed to the lyophilic area as, or immediately after, the part of the gas flow directed to the lyophilic area exits the gas outlet opening.

21. A device manufacturing method comprising:
projecting an image of a pattern through an immersion liquid onto a first substrate held by a substrate table, the immersion liquid being confined between a projection system and a substrate by a liquid confinement structure;
transferring the liquid confinement structure to a measurement table having a target, or a sensor, or both;
unloading the first substrate from the substrate table;
loading a second substrate onto the substrate table;
measuring a property of a target and/or using the sensor; and
displacing liquid from the target and/or the sensor using a flow of gas provided simultaneously to a lyophobic area and a lyophilic area from a gas outlet opening, wherein a property of a part of the gas flow directed to the lyophobic area as, or immediately after, the part of the gas flow directed to the lyophobic area exits the gas outlet opening is different to a property of a part of a gas flow directed to the lyophilic area as, or immediately after, the part of the gas flow directed to the lyophilic area exits the gas outlet opening.

\* \* \* \* \*